US008349686B2

(12) United States Patent
Nitta

(10) Patent No.: US 8,349,686 B2
(45) Date of Patent: Jan. 8, 2013

(54) NONVOLATILE SEMICONDUCTOR MEMORY DEVICE AND METHOD OF MANUFACTURING THE SAME

(75) Inventor: Hiroyuki Nitta, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/197,580

(22) Filed: Aug. 3, 2011

(65) Prior Publication Data

US 2011/0287624 A1 Nov. 24, 2011

Related U.S. Application Data

(62) Division of application No. 12/372,505, filed on Feb. 17, 2009, now Pat. No. 8,008,704.

(30) Foreign Application Priority Data

Feb. 15, 2008 (JP) .................................. 2008-035131

(51) Int. Cl.
*H01L 21/00* (2006.01)
(52) U.S. Cl. ................ 438/258; 438/266; 257/E21.422; 257/E21.682; 257/E27.081; 257/E29.003
(58) Field of Classification Search .......... 438/256–276; 257/E21.179, 422, 682, 27.081, 100, 29.003
See application file for complete search history.

(56) References Cited

U.S. PATENT DOCUMENTS

| 6,353,242 B1 | 3/2002 | Watanabe et al. |
| 6,469,339 B1 | 10/2002 | Onakado et al. |
| 6,894,341 B2 | 5/2005 | Sugimae et al. |
| 7,045,849 B2 | 5/2006 | Chen et al. |
| 7,151,684 B2 | 12/2006 | Matsunaga et al. |

(Continued)

FOREIGN PATENT DOCUMENTS

| JP | 2002-76299 | 3/2002 |
| JP | 2003-197779 | 7/2003 |
| JP | 2006-302950 | 2/2006 |
| JP | 2008-21768 | 1/2008 |

OTHER PUBLICATIONS

Japanese Office Action issued Jun. 15, 2012, in Japan Patent Application No. 2008-035131 (with English Translation).

*Primary Examiner* — Michael Lebentritt
(74) *Attorney, Agent, or Firm* — Oblon, Spivak, McClelland, Maier & Neustadt, L.L.P.

(57) ABSTRACT

To reduce capacitance between each adjacent two word lines in a semiconductor memory device, a first insulating film is formed, with a first gate insulating film thereunder, in an interstice between gates respectively of each adjacent two memory transistors, and in an interstice between a gate of a selective transistor and a gate of a memory transistor adjacent thereto. Additionally, a second insulating film is formed on the first insulating film, sides of the gate of each memory transistor, and a side, facing the memory transistor, of the gate of the selective transistor. A third insulating film is formed parallel to a semiconductor substrate so as to cover a metal silicide film, the first and second insulating films and fourth and fifth insulating films. Avoid part is provided in the interstice between each adjacent two gates of the memory transistors, and in the interstice between the gate of the selective transistor and the gate of the memory transistor adjacent thereto. A bottom and two sides of each void part are shielded by the second insulating film, and a top of each void part is shielded by the third insulating film.

9 Claims, 10 Drawing Sheets

U.S. PATENT DOCUMENTS

| | | |
|---|---|---|
| 7,309,891 B2 | 12/2007 | Yaegashi et al. |
| 7,566,926 B2 | 7/2009 | Matsunaga |
| 7,682,900 B2 | 3/2010 | Kim et al. |
| 7,745,884 B2 | 6/2010 | Sato et al. |
| 7,772,101 B2 | 8/2010 | Chae et al. |
| 7,883,964 B2 * | 2/2011 | Goda et al. .................... 438/258 |
| 8,008,704 B2 * | 8/2011 | Nitta ............................ 257/315 |
| 2006/0258092 A1 | 11/2006 | Sato |
| 2007/0096202 A1 | 5/2007 | Kang et al. |
| 2010/0295113 A1 | 11/2010 | Kang et al. |

* cited by examiner (a)

(b)

(c)

|  | Capacitance between each adjacent two | RC delay |
|---|---|---|
| Conventional | 1 | 1 |
| Embodiment I | 1/3 | 1/3 |

WLc1, WLc2 ··· Capacitance between each adjacent two WL

NONVOLATILE SEMICONDUCTOR MEMORY DEVICE AND METHOD OF MANUFACTURING THE SAME

CROSS REFERENCE TO RELATED APPLICATIONS

This application is a divisional of U.S. application Ser. No. 12/372,505, filed Feb. 17, 2009, which is based upon and claims the benefit of priority from the prior Japanese Patent Application No. 2008-35131, filed on Feb. 15, 2008, the entire contents of which are incorporated herein by reference.

BACKGROUND OF THE INVENTION

1. Field of the Invention

The present invention relates to a semiconductor memory device.

2. Description of the Related Art

An electrically writable and erasable nonvolatile semiconductor memory device is formed by stacking a floating gate insulating film, a floating gate electrode, a control gate insulating film and a control gate electrode on a semiconductor substrate (as disclosed in Japanese Patent Application 2006-319202, for example).

In recent years, progress of miniaturization and high integration of semiconductor devices has caused the following problem in a nonvolatile semiconductor memory device such as a NAND flash memory. Specifically, A distance between control gates has been narrowed and accordingly a large capacitance between each adjacent two control gates has been generated. In addition, the width of each control gate electrode used as a word line has been narrowed and accordingly the wiring resistance of the control gate electrode has increased. As a result, a resistance-capacitance (RC) delay component is increased so that the working speed of the memory transistor and other circuit components is decreased.

BRIEF DESCRIPTION OF SEVERAL VIEWS OF THE DRAWINGS

FIG. 3(b) being a cross-sectional view of a conventional semiconductor memory device; and FIG. 3(c) being a diagram for comparing the semiconductor memory device of Embodiment 1 thereof with a conventional semiconductor memory device, in terms of the RC delay.

DETAILED DESCRIPTION OF THE INVENTION

Figure 1:
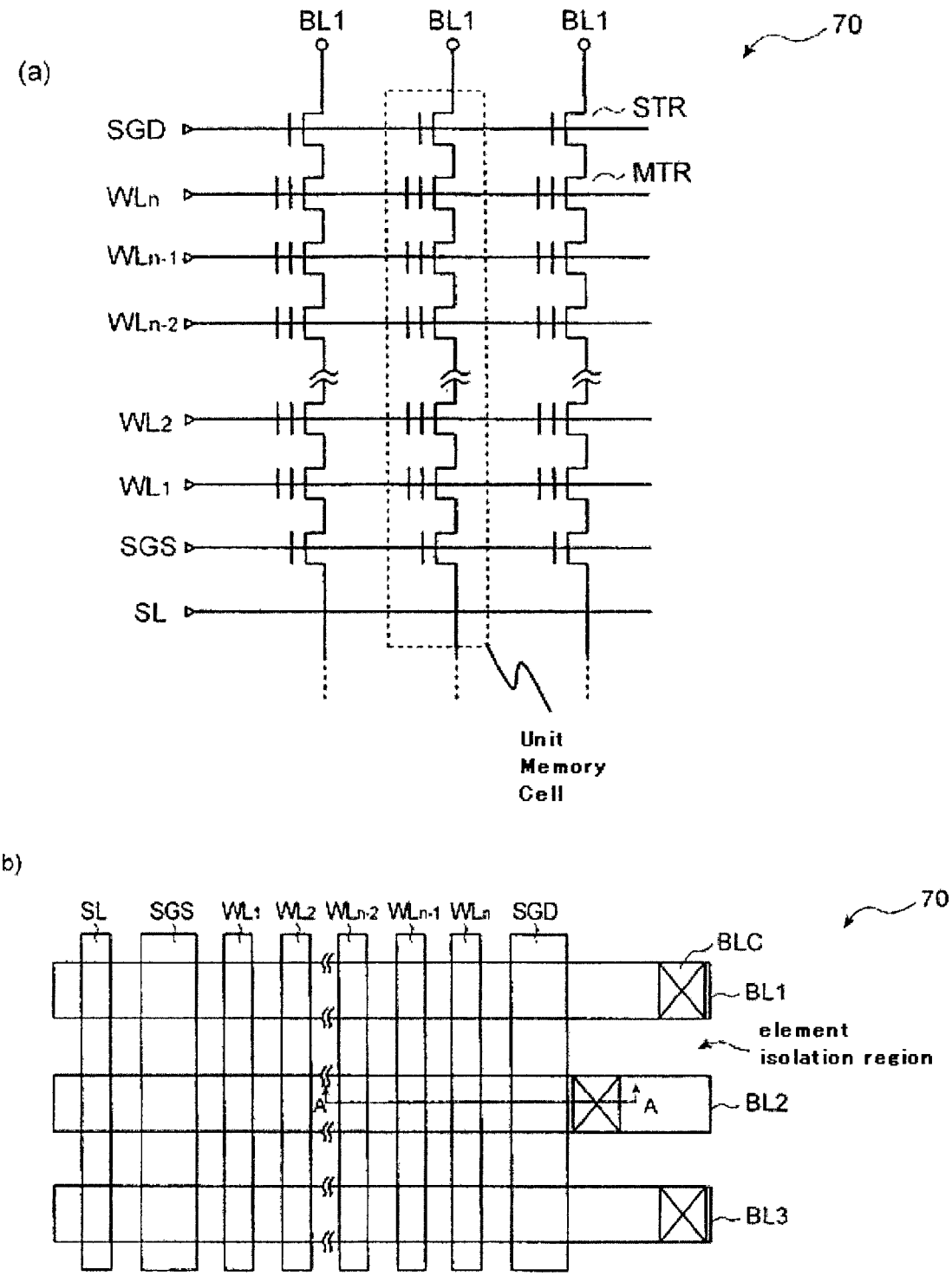
FIGS. 1(a) and 1(b) are diagrams each showing a semiconductor memory device according to Embodiment 1 of the present invention, FIG. 1(a) being a circuit diagram of the semiconductor memory device, and FIG. 1(b) being a plan view showing the semiconductor memory device.

The present invention aims at providing a semiconductor memory device capable of decreasing the capacitance between each adjacent two word lines and a method of manufacturing the same.

A semiconductor memory device according to an aspect of the present invention is characterized by including: A nonvolatile semiconductor memory device comprising: a semiconductor substrate; a first memory transistor including a floating electrode and a control electrode, the floating electrode being provided on the semiconductor substrate via a first gate insulating film, the control electrode being provided on the floating electrode via a second gate insulating film, the first memory transistor having a diffusion layer;

a second memory transistor including the floating electrode and the control electrode and arranged adjacent to the first memory transistor, the floating electrode being provided on the semiconductor substrate via the first gate insulating film, the control electrode being provided on the floating electrode via the second gate insulating film, the second memory transistor having the diffusion layer shared with the first memory cell transistor; a first insulating film formed above the diffusion layer; and a second insulating film provided on the first insulating film and on mutually-opposed sides respectively of gates of the first and second memory transistors, wherein a void part is formed between the mutually-opposed sides respectively of the gates of the first and second memory transistors, a bottom and two sides of the void part being shielded by the second insulating film, and a top of the void part being shielded by a third insulating film.

In addition, a method of manufacturing a semiconductor memory device according to another aspect of the present invention is characterized by including: forming gates respectively of transistors each by selectively stacking a floating electrode, a second gate insulating film and a control electrode film on a semiconductor substrate with a first gate insulating film provided on the semiconductor substrate; depositing a first insulating film between each adjacent two gates of the transistors; etching back the first insulating film to leave a bottom part of the first insulating film between each adjacent two gates of the transistors; forming a second insulating film on the first insulating film and on surfaces of the gates of the transistors; forming a coating film on the second insulating film; etching the coating film and the second insulating film until top surfaces of the gates of the transistors are exposed; forming a third insulating film on the exposed top surfaces of the gates of the transistors; forming an opening portion in an area between each adjacent two areas where the respective transistors are provided, by selectively etching the third insulating film so that the coating film is exposed through the opening portion; and etching the coating film through the opening portion, and thereby forming a void part between each adjacent two gates of the transistors.

The present invention is capable of providing a semiconductor memory device capable of decreasing a capacitance between each adjacent two word lines, and a method of manufacturing the same.

Descriptions will be provided hereinbelow for embodiments of the present invention by referring to the drawings.

(Embodiment 1)

Figure 2:
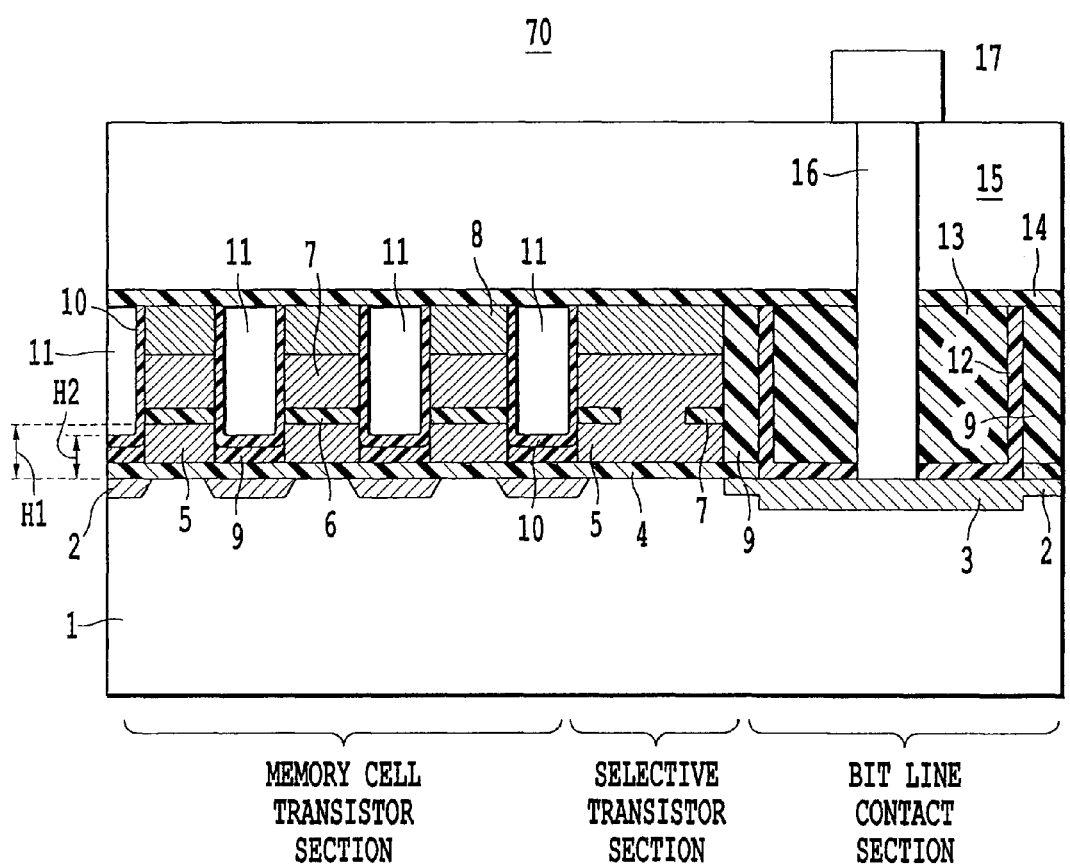
FIG. 2 is a cross-sectional view of the semiconductor memory device taken along the A-A line of FIG. 1(b).

Descriptions will be provided for a semiconductor memory device and a method of manufacturing a semiconductor memory device according to an embodiment 1 of the present invention by referring to the related drawings. FIG. 1 is a diagram showing the semiconductor memory device. FIG. 1(a) is a circuit diagram of the semiconductor memory device, and FIG. 1(b) is a plan view showing the semiconductor memory device. FIG. 2 is a cross-sectional view of the semiconductor memory device taken along the A-A line of FIG. 1(b). In the case of the present embodiment, a void part is provided in an interstice between each adjacent two of memory transistors constituting a unit memory cell.

As shown in FIG. 1(a), a semiconductor memory device 70 is provided with a plurality of unit memory cells. The semiconductor memory device 70 is a NAND flash memory. Each unit memory cell is provided with two selective transistors STR. One selective transistor STR is provided in a part of a bit line BL which part is closer to a sense amplifier (not illustrated) to which the bit line BL is connected, and the other selective transistor STR is provided in another part of the bit line BL which part is closer to a source line SL. In addition, each unit memory cell is provided with a plurality of memory transistors MTR which are cascade connected between the two selective transistors STR. Each of bit lines BL1, BL2, BL3 intersects a control line SGD, word lines WLn, WLn-1, WLn-2, . . . , WL2, WL1, the other control line SGS, and the source line SL.

The control line SGD is connected in common to gates of the respective selective transistors STR located in parts of the respective bit lines BL1 to BL3 which parts are closer to the unillustrated sense amplifier to which the bit lines BL1 to BL3 are connected. The word line WLn is connected in common to control gates of the respective n-th memory transistors MTR connected respectively to the bit lines BL1 to BL3. The word line WLn-1 is connected in common to control gates of the respective (n-1)-th memory transistors MTR connected respectively to the bit lines BL1 to BL3. The word line WLn-2 is connected in common to control gates of the respective (n-2)th memory transistors MTR connected respectively to the bit lines BL1 to BL3. The word line WL2 is connected in common to control gates of the respective 2nd memory transistors MTR connected respectively to the bit lines BL1 to BL3. The word line WL1 is connected in common to control gates of the respective first memory transistors MTR connected respectively to the bit lines BL1 to BL3. The control line SGS is connected in common to gates of the respective selective transistors STR which are closer to the bit lines BL1 to BL3 connected to the source line SL.

In the semiconductor memory device 70, as shown in FIG. 1(b), the source line SL, the control line SGS, the word lines WL1, the word line SL2, . . . , the word line Ln-2, the word line Ln-1, the word line WLn and the control line SGD are separated from one another, and arranged in parallel to one another, in the vertical direction (of FIG. 1(a)). The bit lines BL1 to BL3 are separated from one another, and arranged in parallel to one another, in the horizontal direction (of FIG. 1(a)). An element isolation region is provided between each adjacent two bit lines BL, and thus isolates the adjacent two bit lines BL. A bit line contact BLC is provided to yet another part of each bit line BL which part is located between the control line SGD and the unillustrated sense amplifier.

As shown in FIG. 2, the semiconductor memory device 70 includes diffusion layers 2 which are selectively provided to a first principal plane (top surface) of a semiconductor substrate 1. Each diffusion layer 2 works as a source or drain region of a transistor whose electrical conduction type is the opposite of that of the semiconductor substrate 1. A diffusion layer 3 is in contact with the diffusion layer 2 located in the bit line contact section. The diffusion layer 3 is deeper than the diffusion layer 2, and has the same electrical conduction type as the diffusion layer 2. A first gate insulating film 4 which is a floating gate insulating film, is provided on the semiconductor substrate 1 and the diffusion layers 2.

In the memory transistor section, a floating gate electrode film 5, a second gate insulating film 6 which is a control gate insulating film, a control gate electrode film 7 and a metal silicide film 8 are selectively laid and formed on an interstice between each adjacent two diffusion layers 2 with the first gate insulating film 4 interposed between the floating gate electrode 5 and any one of the semiconductor substrate 1 and the diffusion layers 2.

In the selective transistor section, the floating gate electrode film 5, the second gate insulating film 6, the control gate electrode film 7 and the metal silicide film 8 are selectively laid and formed on an interstice between the adjacent two diffusion layers 2 with the first gate insulating film 4 interposed between the floating gate electrode 5 and each of the semiconductor substrate 1 and the diffusion layer 2. In this respect, the floating gate electrode film 5 and the control gate electrode film 7 are connected to each other by etching and thus removing, for example, a center portion of the second gate insulating film 6. Thus, the floating gate electrode film 5 serves as a floating gate electrode, whereas the control gate electrode film 7 and the metal silicide film 8 serve as a control electrode.

An insulating film 9 is provided on the first gate insulating film 4 between the gates respectively of each adjacent two memory transistors, and between the gate of a memory transistor which is the closest to the selective transistor among the memory transistors and the gate of the selective transistor. An insulating film 10 is provided on each insulating film 9, the side of the gate of each memory transistor, the side of the gate of the selective transistor which side is opposed to the gate of a memory transistor which is the closest to the selective transistor among the memory transistors. In this respect, although each insulating film 9 is provided on the first gate insulating film 4, each insulating film 9 may contact with diffusion layer 2 with no first gate insulating film 4 interposed therebetween. Otherwise, the first gate insulating film 4 may be a multi-layered insulating layer.

An insulating film 9, in which the diffusion layer 2 located on the opposite side of the selective transistor from the memory transistor and on the diffusion layer 2 located in the bit line contact section, is formed on a diffusion layer 2 so as to be as high as the top of the metal silicide film 8. An insulating film 12 is formed so as to be almost as high as the top of the metal silicide film 8, in a part above the diffusion layer 3 in the bit line contact section, and in a part on the side of the insulating film 9 in the bit line contact section. An insulating film 13 is formed so as to be almost as high as the top of the metal silicide film 8, on the insulating film 12.

An insulating film 14 is provided so as to be almost parallel to the semiconductor substrate 1, and to cover the metal silicide film 8, the insulating film 9, the insulating film 10, the insulating film 12 and the insulating film 13. Consequently, a void part 11 is provided in an interstice between the gates respectively of each adjacent two memory transistors, and between the gate of a memory transistor that is adjacent to the selective transistor and the gate of the selective transistor. The bottom and sides of each void part 11 are shielded by the corresponding insulating film 10. The top of each void part 11 is shielded by the insulating film 14. In this respect, a relationship between the height H1 of the bottom of each void part (the height of the top portion of the insulating film 10 located on the insulating film 9) and the height H2 of the top of the corresponding floating gate electrode film 5 is expressed by:

$$H1 < H2 \qquad \text{Expression (1)}$$

An interlayer dielectric 15 is provided on the insulating film 14. An opening portion penetrating the insulating film 12, the insulating film 13, the insulating film 14 and the interlayer dielectric 15 is provided in such a way as to expose part of the diffusion layer 3 located on the bit line contact section. A via contact 16 is embedded in the opening portion. A metal interconnection 17 is provided on the via contact 16, and is connected to the via contact 16. The metal interconnection 17 serves as a bit line BL, and is connected to the unillustrated sense amplifier (not illustrated).

Figure 3:
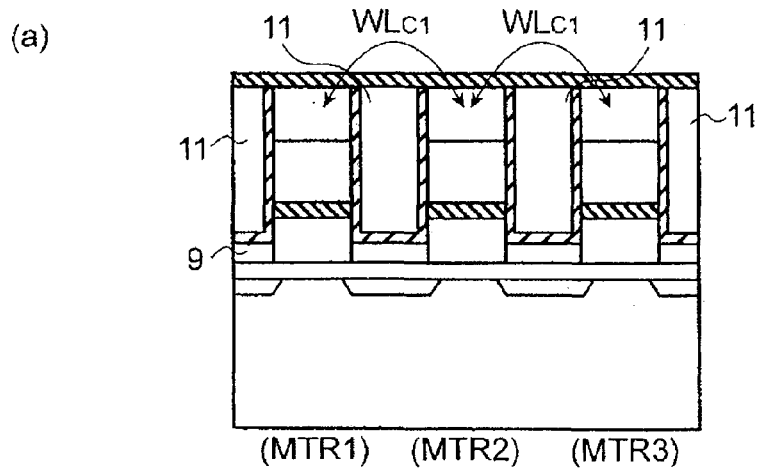
FIGS. 3(a), 3(b) and 3(c) are diagrams for explaining an RC delay which occurs in the semiconductor memory device according to Embodiment 1 of the present invention, FIG. 3(a) being a cross-sectional view of the semiconductor memory device according to Embodiment 1 thereof.
Figure 3:
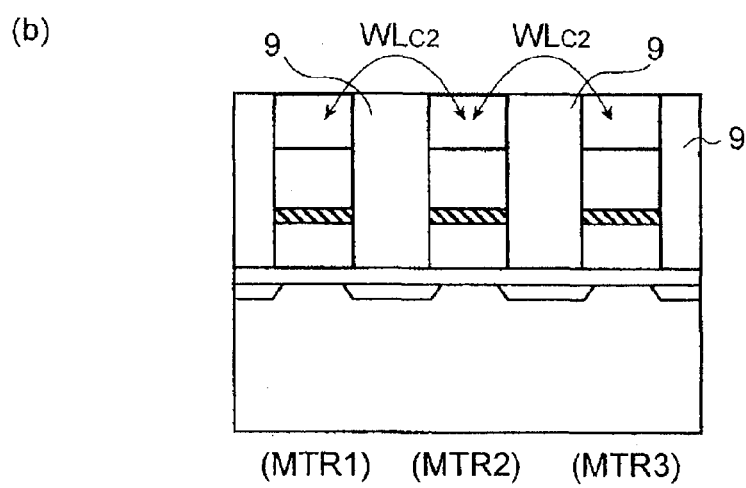

Next, descriptions will be provided for an RC delay which occurs in the semiconductor memory device, by referring to FIGS. 3(a) to 3(c). FIGS. 3A to 3C are drawings and a diagram for explaining the RC delay which occurs in the semiconductor memory device. FIG. 3(a) is a cross-sectional view of the semiconductor memory device according to Embodiment 1. FIG. 3(b) is a cross-sectional view of a conventional semiconductor memory device. FIG. 3(c) is a diagram for comparing the semiconductor memory device according to Embodiment 1 with the conventional semiconductor memory device, in terms of the RC delay. Here, the conventional semiconductor memory device includes an insulating film which is provided between each adjacent two transistors constituting a unit memory cell.

In the case of Embodiment 1, as shown in FIG. 3(a), the void part 11 is provided between each adjacent two memory transistors with the relatively-thin insulating film 10 interposed in between. The void part 11 is filled with air, for example. In the case of the semiconductor memory device according to Embodiment 1, the capacitance WLc1 between each adjacent two word lines is expressed by:

$$WLc1 \approx A(\in 1 \times \in 0)/d \qquad \text{Expression (2)}$$

where d denotes the distance between the gates respectively of each adjacent two memory transistors (the distance between each adjacent two control electrodes), $\in 1$ denotes the dielectric constant of the air, $\in 0$ denotes the dielectric constant, and A denotes the area in which the gates respectively of each adjacent two memory transistors are opposed to each other. Note that the dielectric constant $\in 1$ of the air is equal to 1 (one).

In the case of the conventional semiconductor memory device, as shown in FIG. 3(b), the insulating film 9 is embedded in the interstice between each adjacent two memory transistors. In the conventional semiconductor memory device, the capacitance WLc2 between each adjacent two word lines is expressed by:

$$WLc2 = A(\in 2 \times \in 0)/d \qquad \text{Expression (3)}$$

where d denotes the distance between the gates respectively of each two memory transistors, $\in 2$ denotes the dielectric constant of the insulating film 9, $\in 0$ denotes the dielectric constant, and A denotes the area in which the gates respectively of each adjacent two memory transistors are opposed to each other. The dielectric constant $\in 2$ of the insulating film 9 is equal to 3.45, for example, because an insulating film made of silicon oxide is usually used as the insulating film 9.

Suppose the capacitance WLc2 between each adjacent two word lines in the conventional semiconductor memory device is equal to 1 (one) as shown in FIG. 3(c). In this case, the capacitance WLc1 between each adjacent two word lines in the semiconductor memory device of Embodiment 1 becomes smaller than the capacitance WLc2 of the conventional semiconductor memory device by a capacitance corresponding to the dielectric constant $\in 1$. Then the capacitance WLc1 in Embodiment 1 is reduced to almost one third of the capacitance WLc2 in the conventional semiconductor memory device. As a result, the RC delay which occurs in the memory transistor in the semiconductor memory device of Embodiment 1 is reduced to one third of the RC delay in the conventional semiconductor memory device. In addition, the RC delay occurs in the selective transistor in the semiconductor memory device of Embodiment 1. The RC delay in Embodiment 1 becomes smaller than that in the conventional semiconductor memory device, since the void part 11 is provided to the side of the selective transistor which side is opposed to the memory transistor.

In addition, in the semiconductor memory device of Embodiment 1, it is possible to reduce the capacitance between each adjacent two floating gates and the capacitance between each control gate and its adjacent floating gate compared to the conventional semiconductor memory device.

Because the height H1 of the bottom of each void part 11 is designed to be lower than the height H2 of the top of the corresponding floating gate electrode film. Moreover, in Embodiment 1, each void part 11 is provided on the corresponding first gate insulating film 4, the corresponding insulating film 9 and the corresponding insulating film 10. This reduces damage on the first gate insulating film 4 which occurs during the film processing, compared to each void portion is directly disposed on the first gate insulating film 4 between each two corresponding memory transistors. Accordingly, Embodiment 1 is capable of offering more reliable memory cells.

Figure 11:
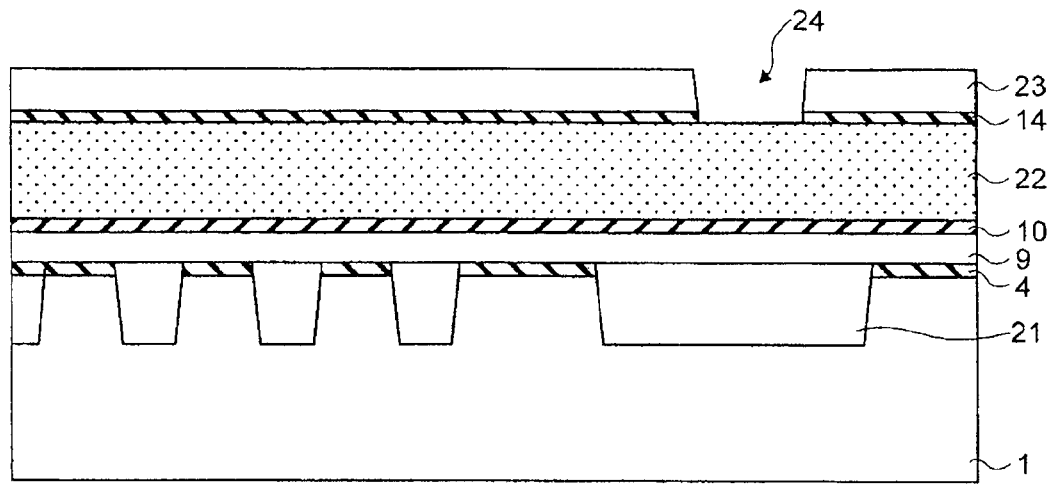
FIG. 11 is a cross-sectional view of the semiconductor memory device taken along the B-B line of FIG. 10(b).

Next, descriptions will be provided for a method of manufacturing a semiconductor memory device according to the present invention by referring to FIGS. 4 to 12. FIGS. 4 to 9 and 12 are cross-sectional views each showing steps included in a method of manufacturing a ferroelectric memory. FIGS. 10(a) and 10(b) are diagrams each showing an opening portion used to form the void part. FIG. 10(a) is a plan view schematically showing the semiconductor memory device. FIG. 10B is an enlarged plan view showing the semiconductor memory device. FIG. 11 is a cross-sectional view of the semiconductor memory device taken along the B-B line of FIG. 10(b).

Figure 4:
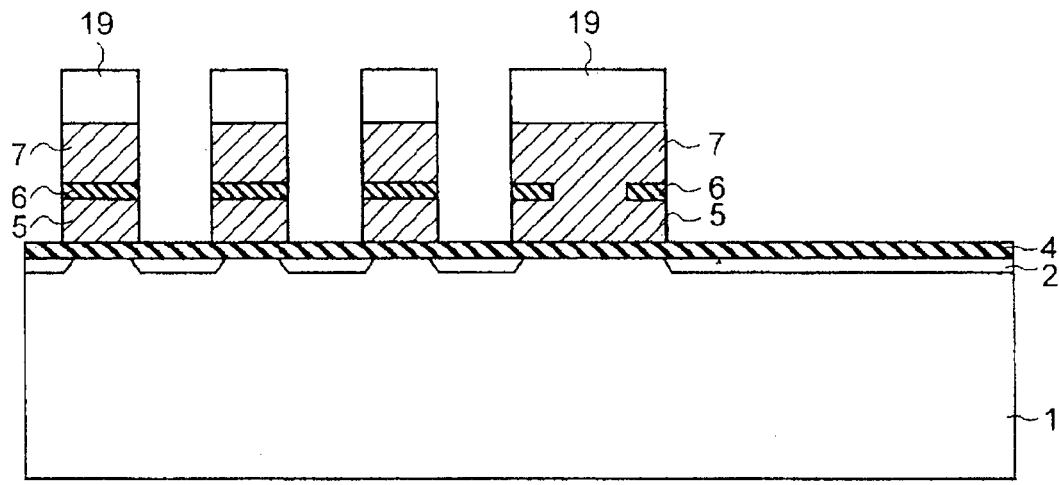
FIG. 4 is a cross-sectional view of the semiconductor memory device in the making for the purpose of showing a first step included in a method of manufacturing the semiconductor memory device according to Embodiment 1 of the present invention.

As shown in FIG. 4, the first gate insulating film 4, the floating gate electrode film 5 and the second gate insulating film 6 are formed on the semiconductor substrate 1. The second gate insulating film 6 in a center portion of the selective transistor section is selectively etched. The reason for selectively etching the second gate insulating film 6 is to fabricate the gate of the selective transistor as a single-layered gate by connecting the floating gate electrode film 5 with the control gate electrode film 7.

Here, illustrations representing well regions, channel regions and the like are omitted in the drawings. The first gate insulating film 4 is fabricated as a tunnel oxide film with a thickness of, for example, 8 nm. The floating gate electrode film 5 is fabricated as a floating gate, and is made of, for example, polycrystalline silicon with a thickness of 80 nm. The second gate insulating film 6 is fabricated as an interpoly insulating film, and is made of ONO (oxide-nitride-oxide) with a thickness of 12 nm.

Subsequently, the control gate electrode film 7 and the insulating film 19 are formed on the second gate insulating film 6. Thereafter, an unillustrated resist pattern is formed by use of a publicly-known lithographic method. By using this resist pattern as a mask, the insulating film 19, the control gate electrode film 7, the second gate insulating film 6 and the floating gate electrode film 5 are continuously etched by Reactive Ion Etching (RIE). Thereby, the gates of the respective memory transistors and the gate of the selective transistor are formed.

Incidentally, after the insulating film 19 is etched by using this resist pattern as a mask, the control gate electrode film 7, the second gate insulating film 6 and the floating gate electrode film 5 may be etched by using the insulating film 19 as a mask. In this respect, the control gate electrode film 7 is fabricated as a control gate, and is made of, for example, polycrystalline silicon with a thickness of 100 nm. The insulating film 19 is fabricated as a mask material used to process the gates, and is made of silicon nitride (SIN) with a thickness of 80 nm.

For example, parts of the semiconductor substrate 1 are implanted with arsenic ions and subjected to heat treatment while using the gate insulating film, the control gate electrode film 7, the second gate insulating film 6 and the floating gate electrode film 5 as a mask. Thereby, the n-diffusion layer 2 is formed, which is of a conduction type opposite to that of the semiconductor substrate 1. Such diffusion layer 2 serves as a source or drain of each of the memory transistors and the selective transistor.

Figure 5:
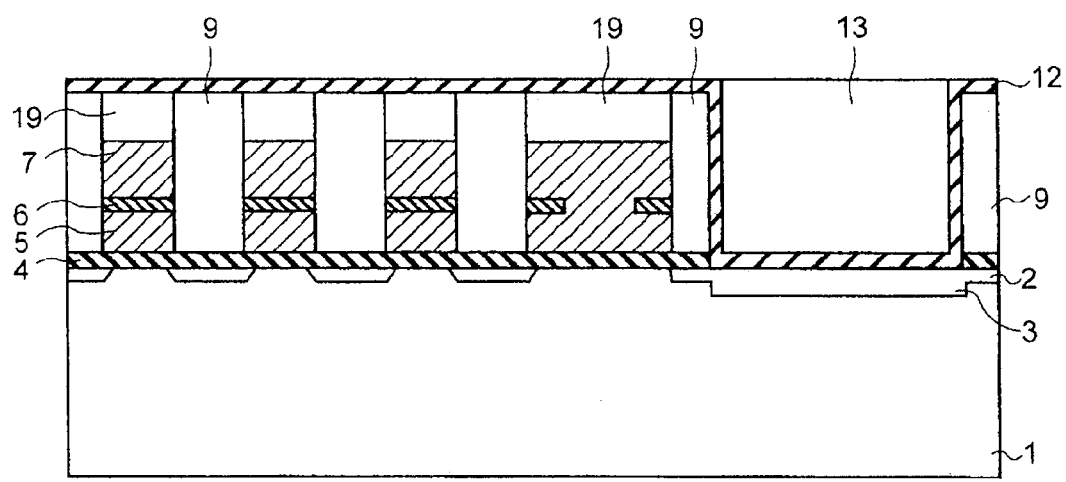
FIG. 5 is a cross-sectional view of the semiconductor memory device in the making for the purpose of showing a second step included in the method of manufacturing the semiconductor memory device according to Embodiment 1 of the present invention.

As shown in FIG. 5, the insulating film 9 is formed the sides of the gate of each memory transistor and the sides of the gate of each selective transistor are covered with the insulating film 9. Thereafter, the insulating film 9 thus formed is etched back down to the height of the top of the insulating film 19. Afterward, the first gate insulating film 4 and the insulating film 9 in the bit line contact section are selectively etched so that the opening portion is formed in the diffusion layer 2 in the bit line contact section. By use of ions injection and heat treatment, the n-diffusion layer 3 (for example, comprising arsenic) is formed, which is of a conduction type opposite to the conduction type of the semiconductor substrate 1. Moreover, the insulating film 12 is continuously formed on the top surface of the gate of each of the memory transistors, on the top surface of the gate of the selective transistor, and on the top surface of the insulating layer 9, as well as along the opening portion on the diffusion layer 3 in the bit line contact section. Note that no insulating film 12 is formed in the interstice between the gates respectively of each adjacent two memory transistors, or in the interstice between the gate of a memory transistor adjacent to the selective transistor and the gate of the selective transistor since these interstices are covered with the insulating film 9. Next, the insulating film 13 is formed on the entire top surface and, and thereafter, the insulating film 13 thus formed is polished and hence evened out, for example, by Chemical Mechanical Polishing (CMP) until the insulating film 12 on each of the memory transistor section and the selective transistor section is exposed. Through this step, the insulating film 13 is embedded into the opening portion with the insulating film 9 underlying the insulating film 13. In this respect, for example, a tetraethylorthosilicate (TEOS) film is used as the insulating film 9. A silicon nitride film is used as the insulating film 12, for example. A borophosphosilicate glass (BPSG) film is used as the insulating film 13, for example.

Figure 6:
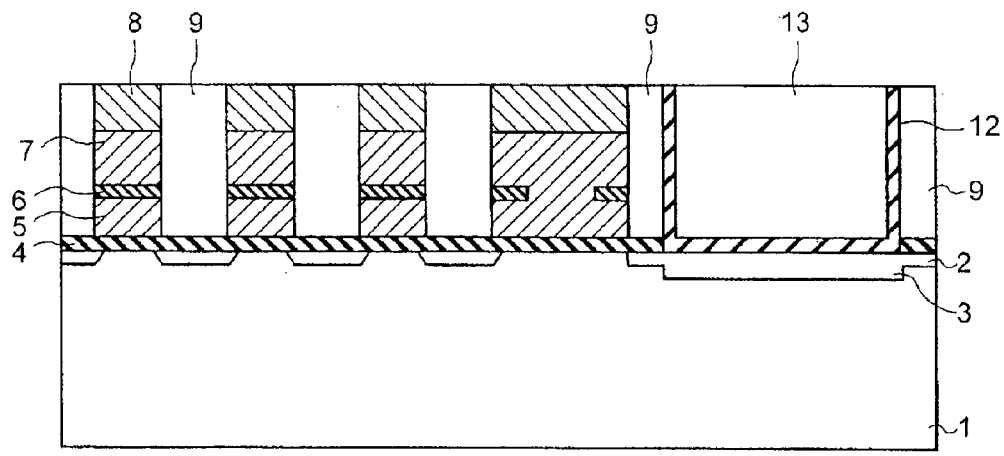
FIG. 6 is a cross-sectional view of the semiconductor memory device in the making for the purpose of showing a third step included in the method of manufacturing the semiconductor memory device according to Embodiment 1 of the present invention.

As shown in FIG. 6, the insulating film 13, the insulating film 12 and the insulating film 19 are etched back until the control gate electrode film 7 is exposed to the outside. Subsequently, a cobalt (Co) film is deposited, for example, by sputtering, followed by heat treatment in a nitrogen atmosphere at a temperature of approximately 800° C. Thereby, the metal silicide film 8 is formed on the control gate electrode film 7. This metal silicide film 8 reduces the sheet resistance of each word line WL to 10Ω/□ or less. Although cobalt is used in this case, different metal (for example, nickel (Ni)) may be used instead.

Figure 7:
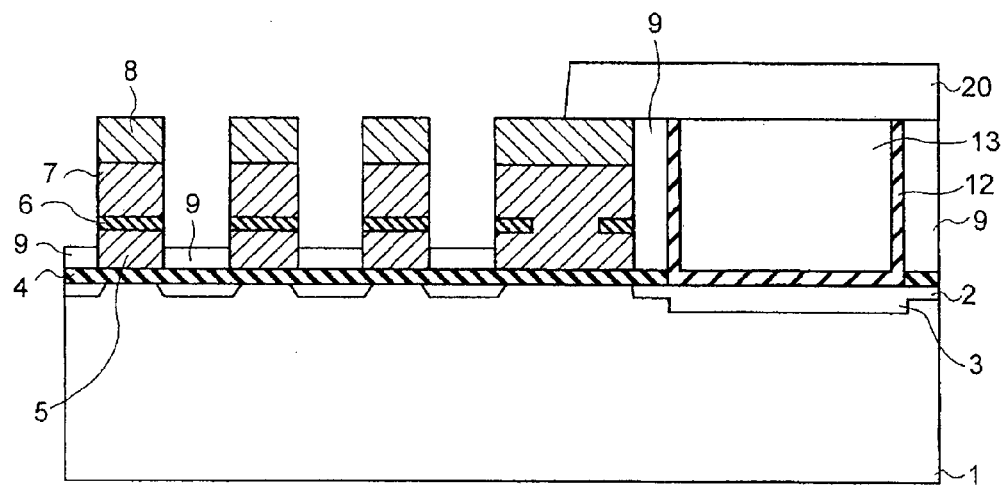
FIG. 7 is a cross-sectional view of the semiconductor memory device in the making for the purpose of showing a fourth step included in the method of manufacturing the semiconductor memory device according to Embodiment 1 of the present invention.

As shown in FIG. 7, a resist film 20 is selectively formed except for the memory transistor section and on part of the selective transistor section, by use of the publicly-known lithographic method. Afterward, the insulating film 9 is etched back by using this resist film 20 as the mask. Part of the insulating film 9 is left in the bottom of the sides of each gate in the memory transistor section and the selective transistor section. In this respect, part of the insulating film 9 thus left in the bottom of the sides of each gate is formed in a way that its top is lower than the top of the floating gate electrode film 5.

Figure 8:
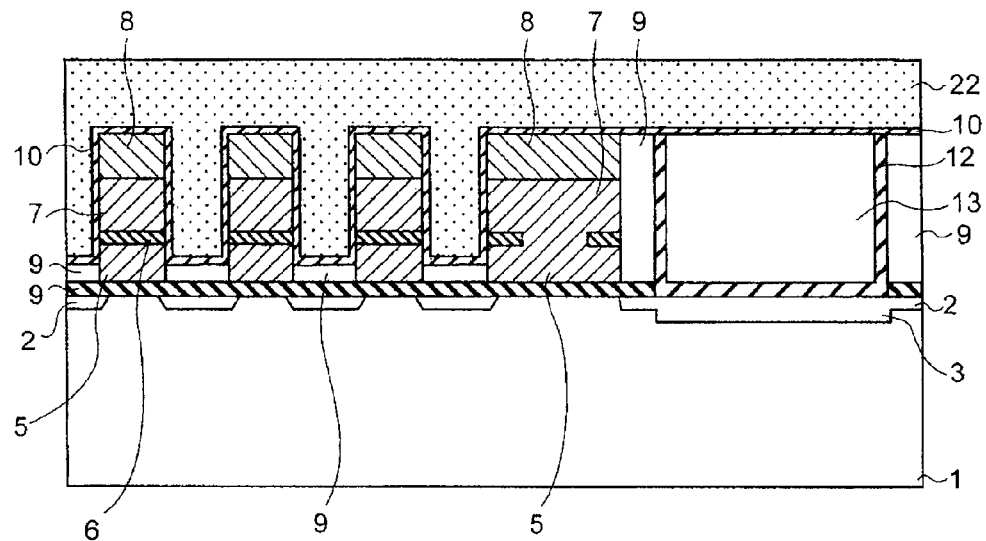
FIG. 8 is a cross-sectional view of the semiconductor memory device in the making for the purpose of showing a fifth step included in the method of manufacturing the semiconductor memory device according to Embodiment 1 of the present invention.

As shown in FIG. 8, the resist film 20 is removed, and then the insulating film 10 is formed. Subsequently, a coating film 22 is formed in a way that the interstice between the gates respectively of each adjacent two memory transistors and the interstice between the gate of a memory transistor adjacent to the selective transistor and the gate of the selective transistor, are coated with the coating film 22. Here, as the insulating film 10, for example, a silicon nitride film is formed with a thickness of 8 nm. A polysilazane film is used as the coating film 22.

A method of forming the polysilazane film is as follows. A mixture of dibutyl ether and perhydrogenated polysilazane is applied onto the semiconductor substrate 1 by spin coating, followed by, for example, wet oxidation treatment at a temperature of approximately 450° C., whereby carbon in the film thus formed is replaced with oxygen. Consequently, the silicon oxide film is formed. Note that, instead of the polysilazane film, an inorganic spin-on-glass (SOG) film such as a HSG film may be used.

Figure 9:
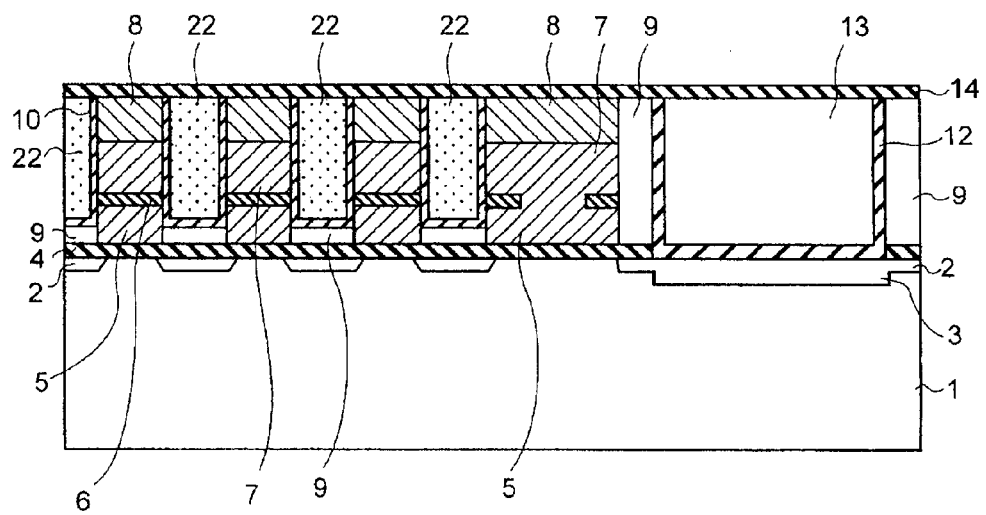
FIG. 9 is a cross-sectional view of the semiconductor memory device in the making for the purpose of showing a 6th step included in the method of manufacturing the semiconductor memory device according to Embodiment 1 of the present invention.
Figure 10:
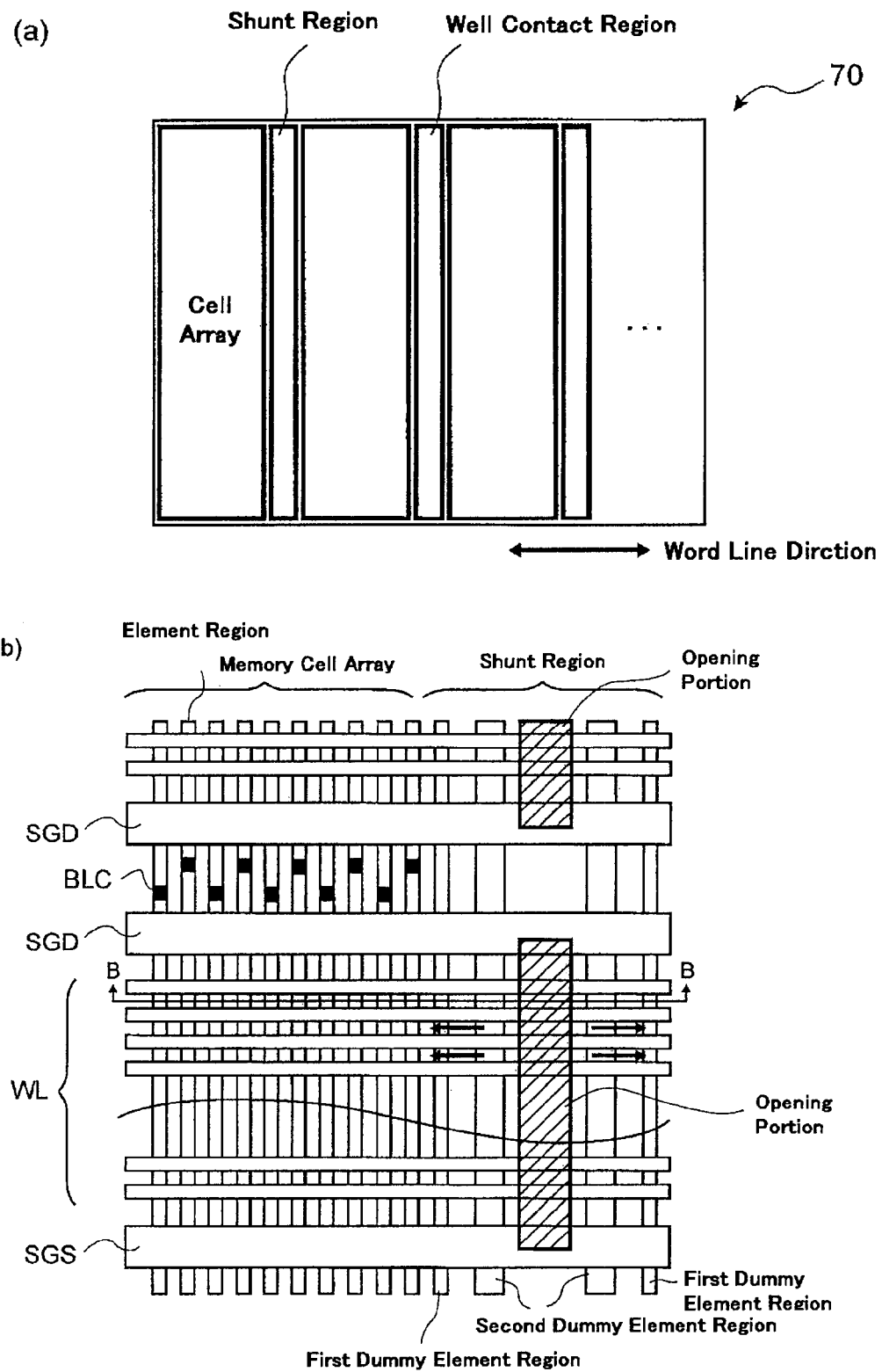
FIGS. 10(a) and 10(b) are diagrams each showing an opening portion used to form a void part according to Embodiment 1 of the present invention, FIG. 10(a) being a plan view schematically showing the semiconductor memory device, and FIG. 10(b) being an enlarged plan view showing the semiconductor memory device.

As shown in FIG. 9, the coating film 22 and the insulating film 10 are polished to be evened out, for example, by CMP until the metal silicide film 8 in each of the memory transistor section and the selective transistor section is exposed. As a result, the coating film 22 is buried in the interstice between the gates respectively of each adjacent two memory transistors, and in the interstice between the gate of a memory transistor adjacent to the selective transistor and the gate of the selective transistor. After the CMP process, the insulating film 14 is formed. As the insulating film 14, a silicon nitride film with a thickness of 30 nm is provided. This silicon nitride film is formed at a temperature of approximately 450° C. or less, for example. Note that it is undesirable that the coating film (the polysilazane film) 22 be thermally treated at a temperature of 450° C. or more, because the coating film (the polysilazane film) 22 is baked hardened, which in turn makes it difficult to remove the coating film (the polysilazane film) 22 in the subsequent steps.

As shown in FIG. 10(a), a shunt region in the semiconductor memory device 70 is provided between a first cell array and a second cell array, and a well contact region is provided between the second cell array and a third cell array. The shunt region is a region for shunting electrical current to the selective gate. Note that the shunt region and the well contact region shown in FIG. 10(a) is a part of an alternate series of shunt regions and well contact regions in the semiconductor memory device. Multiple shunt regions are included in a single semiconductor memory device.

As shown in FIG. 10(b), each shunt region is formed by including two first dummy element regions, two second dummy element regions and a shallow trench isolation (STI). Each first dummy element region is adjacent to the element regions in the corresponding memory cell array. Each second dummy element region is adjacent to the corresponding first dummy element region, and is wider than each first dummy element region. The STI is buried in the semiconductor substrate in an area including the two first dummy element regions and the two second dummy element regions. Note that, for the purpose of reducing the semiconductor memory device in size, either one or both of the first dummy element regions and the second dummy element regions may be omitted in some cases.

Opening portions are provided to each shunt region by removing parts of the insulating film 14 and exposing the coating film 22 to the outside. Each opening portion is provided in such a way as to be parallel to the bit lines BL, and to pass over multiple word lines WL. In Embodiment 1, each opening portion is narrower in width than the STI between the two second dummy element regions, and is formed between the two second dummy element regions. However, the conditions for forming the opening portion are not limited to the opening portion being narrower in width than the STI between the two second dummy element regions or the opening portion being formed above none of the two second dummy element regions. The reason for this is as follows.

Even when the opening portion is wider in width than the STI between the two second dummy element regions and the opening portion is formed in such a way as to cover the two second dummy element regions, the effects which the present invention aims at can be obtained regardless of the width of the opening portion if no interlayer dielectric 15 is formed in the interstice between each adjacent two memory transistors through the opening portion when the interlayer dielectric 15 is later formed on the insulating film 14.

In addition, each opening portion is formed in such a way as to pass over all of the word lines WL between the corresponding control lines SGD and SGS. Furthermore, each opening portion extends up to a part of the control line SGD, and up to a part of the control line SGS. That is because consideration is given to a possibility that lithography may be applied to a location shifted from an intended location when the opening portion is formed.

This opening portion is used to form its corresponding void part 11. Specifically, as shown in FIG. 11, an opening portion 24 is formed by etching, with use of RIE, a part of the insulating film 14 above the shallow trench isolation (STI) 21 buried in the semiconductor substrate 1, while using the resist film 23 as the mask. Then each of the void part 11 in FIG. 2 extends to shunt region, and contact with the opening portion 24.

Figure 12:
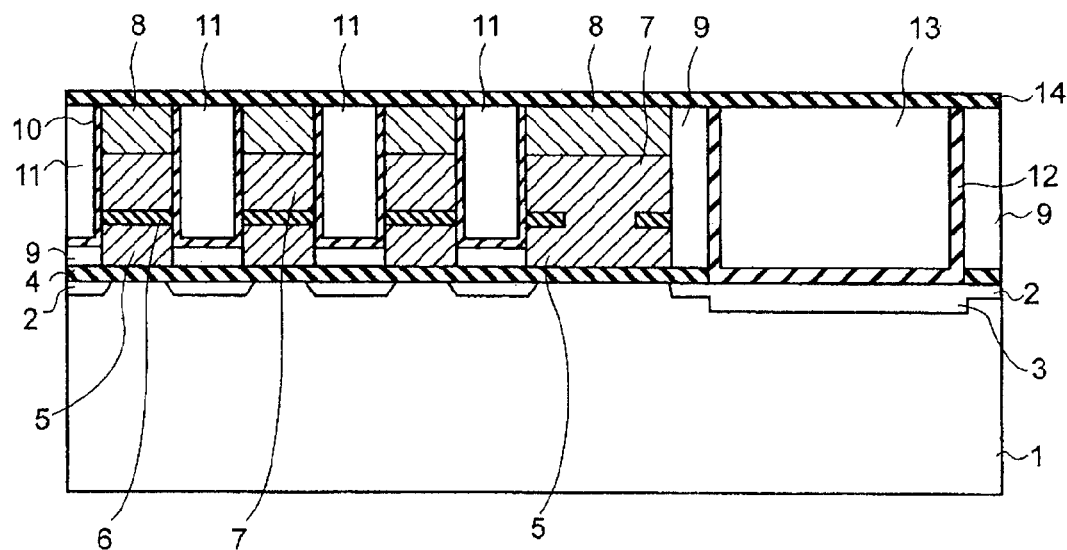
FIG. 12 is a cross-sectional view of the semiconductor memory device in the making for the purpose of showing a 7th step included in the method of manufacturing the semiconductor memory device according to Embodiment 1 of the present invention.

Subsequently, as the polysilazane film, the coating film 22 is etched through the opening portion 24 by use of buffer hydrogen fluoride (BHF) obtained by diluting hydrogen fluoride (HF) into 2% concentration. Here, as the silicon nitride films, the insulating film 10 and the insulating film 14 are hardly etched with the buffer hydrogen fluoride (BHF). In other words, the buffer hydrogen fluoride has a very high selective etching ratio to the coating film 22. Consequently, as shown in FIG. 12, the void part 11 is provided in the interstice between the gates respectively of each adjacent two memory transistors and in the interstice between the gate of a memory transistor adjacent to the selective transistor and the gate of the selective transistor.

Thereafter, the interlayer dielectric 15 is formed. The interlayer dielectric 15 is provided on the insulating film 14 and on the opening portion. As shown in FIG. 10(b), the opening portion is provided in the shunt region separated away from the adjacent cell arrays. For this reason, the interlayer dielectric 15 reaches no void part 11, and thus the void part 11 holds air, for example. After the interlayer dielectric 15 is formed, an opening portion is provided in the bit line contact section. Thereafter, the via contact 16 is buried in the opening portion. The metal interconnection 17 to be connected to the via contact 16 is formed on the via contact 16. After the metal interconnection 17 is formed, interlayer dielectrics and interconnection layers are formed by use of the publicly-known techniques. Consequently, the semiconductor memory device 70 as the NAND flash memory is completed.

In the case of the semiconductor memory device and the method of manufacturing the same according to Embodiment 1, as described above, the memory transistors and the selective transistors are provided to the unit memory cell. The gate of each memory transistor is formed by sequentially stacking the first gate insulating film 4, the floating gate electrode film 5, the second gate insulating film 6, the control gate electrode film 7 and the metal silicide film 8. The gate of the selective transistor is formed by sequentially stacking the first gate insulating film 4, the floating gate electrode film 5, the second gate insulating film 6, the control gate electrode film 7 and the metal silicide film 8. In the gate of the selective transistor, the center portion of the second gate insulating film 6 is removed by etching, and thereby the floating gate electrode film 5 is connected to the control gate electrode film 7. The insulating film 10 is provided on each of insulating films 9, the sides of the gate of each memory transistor, and the side of the gate of the selective transistor, which side is opposed to the gate of a memory transistor adjacent to the selective memory transistor. The insulating film 14 is provided so as to be in parallel with the semiconductor substrate 1, and to cover the metal silicide film 8, the insulating film 9, the insulating film 10, the insulating film 12 and the insulating film 13. The void part 11 is provided in the interstice between the gates respectively of each adjacent two memory transistors, and in the interstice between the gate of a memory transistor adjacent to the selective transistor and the gate of the selective transistor. The bottom and sides of each void part 11 are shielded by the corresponding insulating film 10, and the top of each void part 11 is shielded by the insulating film 14. Each void part 11 is filled with air, for example. The coating film 22 buried in the interstice between the gates respectively of each adjacent two memory transistors and the coating film 22 buried in the interstice between the gate of a memory transistor adjacent to the selective transistor and the gate of the selective transistor, are removed by etching with use of buffer hydrogen fluoride, through the opening portion formed in the shunt region. Thereby, each void part 11 is formed.

Accordingly, Embodiment 1 is capable of reducing the capacitance between the gates respectively of each adjacent two memory transistors, and the capacitance between the gate of a memory transistor adjacent to the selective transistor and the gate of the selective transistor. For this reason, even if the semiconductor memory device 70 is further miniaturized and more highly integrated, Embodiment 1 is capable of reducing the component which causes the RC delay in the semiconductor memory device 70, and of controlling the decrease of the working speed of the transistors to a larger extent than the conventional techniques. Furthermore, Embodiment 1 is capable of controlling the increase of a leakage current in each transistor, since the void parts 11 are provided on the respective groups each consisting of the first gate insulating film 4, the insulating film 9 and the insulating film 10.

Note that the semiconductor memory device and the method of manufacturing the same according to Embodiment 1 can be applied to a NOR flash memory as well as an AND flash memory.

Embodiment 2

Figure 13:
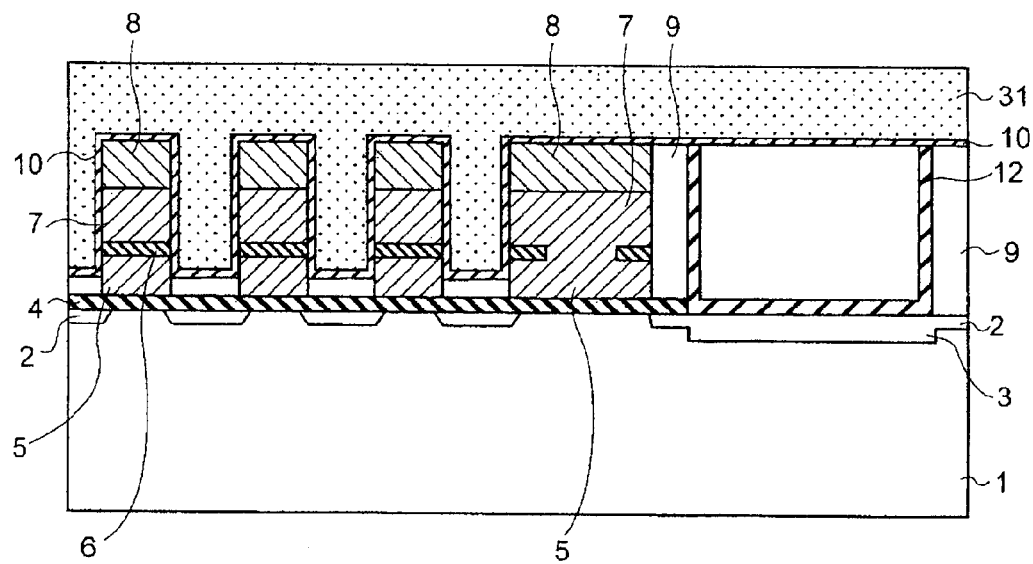
FIG. 13 is a cross-sectional view of a semiconductor memory device in the making for the purpose of showing a first step included in a method of manufacturing a semiconductor memory device according to Embodiment 2 of the present invention.
Figure 14:
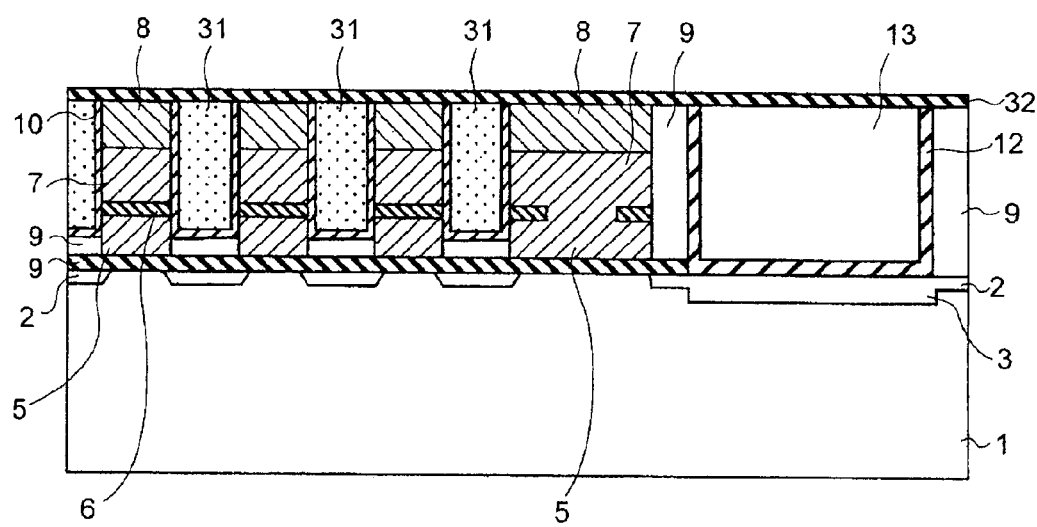
FIG. 14 is a cross-sectional view of the semiconductor memory device in the making for the purpose of showing a second step included in the method of manufacturing the semiconductor memory device according to Embodiment 2 of the present invention.
Figure 15:
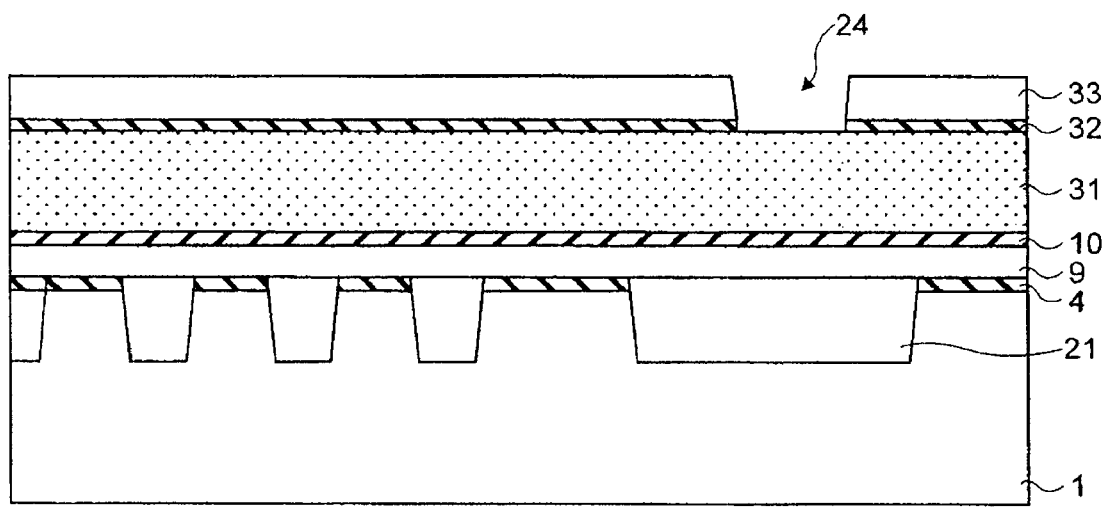
FIG. 15 is a cross-sectional view of the semiconductor memory device in the making for the purpose of showing a third step included in the method of manufacturing the semiconductor memory device according to Embodiment 2 of the present invention.

Next, descriptions will be provided for a semiconductor memory device and a method of manufacturing the same according to Embodiment 2 by referring to the related drawings. FIGS. 13 to 15 are cross-sectional views each showing a step included in the method of manufacturing the semiconductor memory device. Embodiment 2 is different from Embodiment 1 in terms of the method of forming a void part in each adjacent two of the transistors constituting a unit cell memory.

Hereinbelow, components which are the same as those of Embodiment 1 will be denoted by the same reference numerals, and descriptions for those components will be omitted. Descriptions will be provided for components which are different from those of Embodiment 1.

As shown in FIG. 13, the semiconductor memory device according to Embodiment 2 is constructed in the same method as the semiconductor memory device of Embodiment 1, until the insulating film 10 is formed. After the insulating film 10 is formed, a coating film 31 is formed so as to cover the interstice between the gates respectively of each adjacent two memory transistors and the interstice between the gate of a memory transistor adjacent to the selective memory among the memory transistors and the gate of selective transistor.

Here, as an organic SOG film, a poly-allyl ether (PAE) film is used as the coating film 31.

A method of forming the PAE film is as follows. An organic solvent solution of PAE is applied onto the semiconductor substrate 1 (by spin coating), followed by heat treatment at a temperature of approximately 400° C., for example. Thereby, PAE is polymerized. A mixed solution obtained by mixing the organic solvent solution of PAE and an organic solvent solution of an organic acid (for example, abietic acid), may be applied onto the semiconductor substrate 1 (by spin coating), followed by heat treatment at a temperature of approximately 400° C., for example. Thereby, the organic film is polymerized.

As shown in FIG. 14, the coating film 31 and the insulating film 10 are flash, for example, by CMP until the metal silicide film 8 in the memory transistor section and the selective transistor section is exposed. Consequently, the coating film 31 is buried in the interstice between the gates respectively of each adjacent two memory transistors, and in the interstice between the gate of a memory transistor adjacent to the selective transistor and the gate of the selective transistor. After the coating film 31 and the insulating film 10 are flash, an insulating film 32 is formed. As the insulating film 32, a silicon nitride film formed at a temperature of approximately 400° C. or less is provided with a thickness of 30 nm. It is undesirable that heat treatment should be applied to the coating film 31 at a temperature of 400° or more, because the coating film 31 is bake hardened, which in turn makes it difficult to remove the coating film 31 in the subsequent steps.

As shown in FIG. 15, part of the insulating film 32 located above the STI 21 buried in the semiconductor substrate 1 in the shunt region is etched by RIE with a resist film 33 as the mask. Thereby, the opening portion 24 is formed. Afterward, part of the coating film 31 and part of the resist film 33 are removed, for example, by oxygen plasma treatment. Here, as the silicon nitride films, the insulating film 10 and the insulating film 32 are not etched by the oxygen plasma treatment. Consequently, like in Embodiment 1, the void part 11 is provided in the interstice between the gates respectively of each adjacent two memory transistors, and in the interstice between the gate of a memory transistor adjacent to the selective memory and the gate of the selective transistor. Subsequent steps are the same as those in Embodiment 1, thus descriptions for the subsequent steps will be omitted.

In the case of the semiconductor memory device and the method of manufacturing the same according to Embodiment 2, as described above, the memory transistors and the selective transistors are provided to the unit memory cell. The gate of each memory transistor is formed by sequentially stacking the first gate insulating film 4, the floating gate electrode film 5, the second insulating film 6, the control gate electrode film 7 and the metal silicide film 8. The gate of each selective memory is formed by sequentially stacking the first gate insulating film 4, the floating gate electrode film 5, the second gate insulating film 6, the control gate electrode film 7 and the metal silicide film 8. In the gate of the selective memory, the center portion of the second gate insulating film 6 is removed by etching, and thereby the floating gate electrode film 5 are connected to the control gate electrode film 7. The insulating film 10 is provided on each insulating films 9, the sides of the gate of each memory transistor, and the side of the gate of the selective transistor which side is opposed to the gate of a memory transistor adjacent to the selective memory transistor. The insulating film 32 is provided in parallel with the semiconductor substrate 1 so as to cover the metal silicide film 8, the insulating film 9, the insulating film 10, the insulating film 12 and the insulating film 13. The void part 11 is provided in the interstice between the gates respectively of each adjacent two memory transistors, and in the interstice between the gate of a memory transistor adjacent to the selective transistor and the gate of the selective transistor. The bottom and sides of each void part 11 are shielded by the corresponding insulating film 10, and the top of each void part 11 is shielded by the insulating film 32. Each void part 11 is filled with, for example, air. The coating film 31 buried in the interstice between the gates respectively of each adjacent two memory transistors and in the interstice between the gate of a memory transistor is adjacent to the selective transistor and the gate of the selective transistor, are removed by oxygen plasma treatment through the opening portion formed in the shunt region. Thereby, each void part 11 is formed.

Accordingly, Embodiment 2 is capable of reducing the capacitance between the gates respectively of each adjacent two memory transistors, and the capacitance between the gate of a memory transistor adjacent to the selective transistor and the gate of the selective transistor. For this reason, even if the semiconductor memory device 70 is further reduced in size and more highly integrated, Embodiment 2 is capable of reducing the component which causes the RC delay, and of controlling the decrease of the working speed of the transistors to a larger extent than the conventional techniques. Furthermore, Embodiment 2 is capable of controlling the increase of a leakage current in each transistor, since the void parts 11 are provided on the respective groups each consisting of the first gate insulating film 4, the insulating film 9 and the insulating film 10.

Moreover, since the PAE is removable by the oxygen plasma treatment, when a silicon nitride film or a silicon oxide film is used for the insulating film 10 for example, Embodiment 2 is capable of increasing the selective etching ratio between the PAE film and the silicon nitride film or the silicon oxide film which is applied when the void parts 11 are formed.

The present invention is not limited to the foregoing embodiment. The present invention may be modified variously without departing from the scope of the present invention.

For example, although the PAE film is used as the coating film 31 in Embodiment 2, an organic SOG film as a polyimide-based polyether film or a methylsesquioxane film may be used instead.

Constitutions described in the following appendices are conceivable for the present invention.

Appendix 1

A method of manufacturing a semiconductor memory device includes the steps of: forming gates of the respective transistors each by selectively stacking a floating electrode, a second gate insulating film, a control electrode film and a metal silicide film, on a semiconductor substrate with a first gate insulating film being interposed between the floating electrode and the semiconductor substrate; leaving part of a first insulating film in a bottom in an interstice between the gates respectively of each adjacent two transistors, by etching back the first insulating film provided in the interstice between the gates respectively of the adjacent two transistors; forming a second insulating film on the first insulating film and in vicinities of the gates of the corresponding adjacent two transistors; forming a coating film on the second insulating film; polishing and thus evening out the coating film and the second insulating film until a top surface of the metal silicide film is exposed to the outside; forming a third insulating film on the metal silicide film thus exposed to the outside; forming an opening portion in a region separated away from another region where the transistors are provided by selectively etching the third insulating film; forming a void part in the interstice between the gates respectively of each adjacent two transistors by etching a corresponding part of the coating film through the opening portion; and forming an interlayer dielectric on the third insulating film. In the case of this method, the top of each void part is shield by the third insulating film, and the bottom and two sides of void part are shielded by the second insulating film.

Appendix 2

In the case of the method of manufacturing a semiconductor memory device recited in Appendix 1, the coating film is etched with the solution of buffer hydrogen fluoride, and the coating film is an inorganic SOG film, as well as the second and third insulating films are each the silicon nitride film.

Appendix 3

In the case of the method of manufacturing a semiconductor memory device recited in Appendant 2, the inorganic SOG film is a polysilazane film or an HSG film.

Appendix 4

A method of manufacturing a semiconductor memory device includes the steps of: forming gates of the respective transistors each by selectively stacking a floating electrode, a second gate insulating film, a control electrode film and a metal silicide film, on a semiconductor substrate with a first gate insulating film being interposed between the floating electrode and the semiconductor substrate; leaving part of a first insulating film in a bottom in an interstice between the gates respectively of each adjacent two transistors by etching back the first insulating film provided in the interstice between the gates respectively of the adjacent two transistors; forming a second insulating film on the first insulating film and in vicinities of the gates of the corresponding adjacent two transistors; forming an organic coating film on the second insulating film; polishing and thus evening out the organic coating film and the second insulating film until a top surface of the metal silicide film is exposed to the outside; forming a third insulating film on the metal silicide film thus exposed to the outside; forming an opening portion in a region separated away from another region where the transistors are provided by selectively etching the third insulating film; and forming a void part in the interstice between the gates respectively of each adjacent two transistors by removing a corresponding part of the organic coating film by oxygen plasma treatment through the opening portion.

Appendix 5

In the case of the method of manufacturing a semiconductor memory device as recited in Appendix 4, the organic coating film is a poly-allyl ether film, a polyimide polyether film or a methylsesquioxane film.

Appendix 6

In the case of the method of manufacturing a semiconductor memory device as recited in Appendices 1 to 5, the opening portion is provided in a shunt region through which a portion of the electrical current is diverted to the selective gate by means of an electrical shunt.

What is claimed is:

1. A method of manufacturing a nonvolatile semiconductor memory device comprising:
   forming gates respectively of transistors each by selectively stacking a floating electrode, a second gate insulating film and a control electrode film on a semiconductor substrate with a first gate insulating film provided on the semiconductor substrate;
   depositing a first insulating film between each adjacent two gates of the transistors;

etching back the first insulating film to leave a bottom part of the first insulating film between each adjacent two gates of the transistors;

forming a second insulating film on the first insulating film and on surfaces of the gates of the transistors;

forming a coating film on the second insulating film;

etching the coating film and the second insulating film until top surfaces of the gates of the transistors are exposed;

forming a third insulating film on the exposed top surfaces of the gates of the transistors;

forming an opening portion in an area in a shunt region between each adjacent two areas where the respective transistors are provided, by selectively etching the third insulating film so that the coating film is exposed through the opening portion; and etching the coating film through the opening portion to form between each adjacent two gates of the transistors a void part extending to the shunt region.

2. The method according to claim 1, wherein
the coating film is an inorganic SOG film, and
the second and third insulating films are each a silicon nitride film.

3. The method according to claim 1, wherein the shunt region is arranged between each adjacent two memory cell arrays provided in said adjacent two areas.

4. The method according to claim 1, wherein the coating film is made of polysilazane.

5. The method according to claim 4, wherein the second insulating film is a silicon nitride film.

6. The method according to claim 1, wherein wet etching that uses buffer hydrogen fluoride is performed during etching the coating film through the opening portion, thereby forming a void part between each adjacent gates of the transistors.

7. The method according to claim 1, wherein
the transistors are memory transistors arranged in a matrix,
the gates are word lines extending in a first direction, and
the word lines are arranged at equal intervals in a second direction orthogonal to the first direction.

8. The method according to claim 7, wherein the opening portion is formed so as to pass over the word lines.

9. The method according to claim 7, wherein
the nonvolatile semiconductor memory device further includes control gate lines each extending in the second direction and being adjacent to the word lines, and
the opening portion is formed so as to pass over the word lines and the control gate lines.

* * * * *